(12) United States Patent
Kim et al.

(10) Patent No.: US 8,563,144 B2
(45) Date of Patent: *Oct. 22, 2013

(54) ORGANIC ELECTROLUMINESCENCE DEVICE AND METHOD FOR FABRICATING THE SAME

(75) Inventors: Myung Seop Kim, Seoul (KR); Jeong Dae Seo, Gwacheon-si (KR); Jac Man Lee, Seoul (KR); Kyung Hoon Lee, Seoul (KR); Chang Je Sung, Seoul (KR); Sang Tac Park, Gyeonggi-do (KR); Eun Soo Cha, Gwacheon-si (KR)

(73) Assignee: LG Display Co., Ltd., Seoul (KR)

( * ) Notice: Subject to any disclaimer, the term of this patent is extended or adjusted under 35 U.S.C. 154(b) by 820 days.

This patent is subject to a terminal disclaimer.

(21) Appl. No.: 11/357,951

(22) Filed: Feb. 22, 2006

(65) Prior Publication Data

US 2007/0020484 A1    Jan. 25, 2007

(30) Foreign Application Priority Data

Jul. 25, 2005   (KR) .................. 10-2005-0067301

(51) Int. Cl.
*H01L 51/54* (2006.01)

(52) U.S. Cl.
USPC ............... 428/690; 428/917; 427/58; 427/66; 313/502; 313/504; 257/40

(58) Field of Classification Search
USPC ........................................................ 428/690
See application file for complete search history.

(56) References Cited

U.S. PATENT DOCUMENTS

| | | | |
|---|---|---|---|
| 6,180,217 B1 * | 1/2001 | Ueda et al. ................ | 428/212 |
| 6,420,031 B1 * | 7/2002 | Parthasarathy et al. .... | 428/411.1 |
| 6,627,333 B2 * | 9/2003 | Hatwar ................... | 428/690 |
| 6,639,357 B1 * | 10/2003 | Parthasarathy et al. ...... | 313/504 |
| 6,703,180 B1 | 3/2004 | Boroson et al. ........... | 430/200 |
| 6,717,358 B1 * | 4/2004 | Liao et al. ............... | 313/504 |
| 6,750,608 B2 * | 6/2004 | Matsuura et al. .......... | 313/504 |
| 2001/0009690 A1 * | 7/2001 | Choong et al. ............ | 427/66 |
| 2001/0052751 A1 | 12/2001 | Wakimoto et al. .......... | 313/504 |
| 2001/0054711 A1 * | 12/2001 | Numao .................... | 257/72 |
| 2002/0081456 A1 * | 6/2002 | Hamada ................... | 428/690 |
| 2002/0086180 A1 * | 7/2002 | Seo et al. ................ | 428/690 |
| 2002/0113546 A1 | 8/2002 | Seo et al. ................ | 313/504 |
| 2004/0075384 A1 * | 4/2004 | Aoki ..................... | 313/506 |
| 2004/0086743 A1 * | 5/2004 | Brown et al. ............. | 428/690 |
| 2004/0142207 A1 | 7/2004 | Wang .................... | 428/690 |
| 2004/0185297 A1 | 9/2004 | Klubek et al. ............ | 428/690 |
| 2004/0207318 A1 * | 10/2004 | Lee et al. ................ | 313/506 |
| 2004/0219390 A1 * | 11/2004 | Potrawa et al. ........... | 428/690 |
| 2004/0253413 A1 * | 12/2004 | Baba et al. ............... | 428/141 |
| 2005/0089717 A1 * | 4/2005 | Cosimbescu et al. ........ | 428/690 |
| 2005/0112403 A1 * | 5/2005 | Ju et al. ................. | 428/690 |
| 2005/0151466 A1 | 7/2005 | Liao et al. ............... | 313/504 |
| 2007/0020483 A1 * | 1/2007 | Park et al. ............... | 428/690 |

FOREIGN PATENT DOCUMENTS

| | | |
|---|---|---|
| CN | 1217582 A | 5/1999 |
| CN | 1362746 A | 8/2002 |
| CN | 1378409 A | 11/2002 |
| CN | 1438828 A | 8/2003 |
| EP | 1220339 | 7/2002 |
| EP | 1220340 | 7/2002 |
| JP | 10-270171 A | 10/1998 |
| JP | 10-270172 A | 10/1998 |
| JP | 2000-150165 | 5/2000 |
| JP | 2001-237079 A | 8/2001 |
| JP | 2001-313180 | 11/2001 |
| JP | 2002-043063 A | 2/2002 |
| JP | 2002-198176 A | 7/2002 |
| JP | 2002-313583 A | 10/2002 |
| JP | 2003-272870 | 9/2003 |
| JP | 2004-119145 | 4/2004 |
| JP | 2005-063831 A | 3/2005 |
| JP | 2005-093159 | 4/2005 |
| JP | 2005-108441 | 4/2005 |
| WO | WO 03079737 A2 * | 9/2003 |
| WO | 2004/057926 A1 | 7/2004 |

OTHER PUBLICATIONS

Korean Office Action Dated Sep. 26, 2006.
The extended European search report dated Jul. 11, 2011 in the corresponding European patent application No. 06003603.5.

* cited by examiner

*Primary Examiner* — Gerard Higgins
*Assistant Examiner* — Andrew K Bohaty
(74) *Attorney, Agent, or Firm* — Morgan, Lewis & Bockius LLP

(57) ABSTRACT

An organic electroluminescent (EL) device is provided which uses an electron-transport layer including hole blocking capability. The device includes a stack structure, with an emitting layer and an electron-transport layer provided between an anode and a cathode. The electron-transport layer is a mixture of at least two materials. This mixture may include an organic compound and one or more other organic compounds, or may include a metal or inorganic compound and one or more other metal or inorganic compounds, or may include one or more organic compounds and one or more metal or inorganic compounds. By incorporating a hole blocking capability into the electron-transport layer, structure and fabrication of the device is simplified and efficiency is increased.

11 Claims, 24 Drawing Sheets

Balq [aluminum(III) bis(2-methyl-8-quinolinato) 4-phenylphenolate]

BCP [2,9-Dimethyl-4,7-diphenyl-1,10-phenanthroline]

CBP [4,4'-N,N'-dicarbazole-1,1'-biphenyl]

CF-X

CF-Y oxidiazole derivative triazole derivative thiophene derivative pyrrole derivative sila-cyclopentadiene derivative anthracene derivative pyrene derivative perylene derivative Alq3[Tris-(8-hydroxyquinolinolato)-aluminium]

BeBq2 [Bis(10-hydroxybenzo[h]quinolinato)beryllium]

Zn(oxz)2 [Bis(2-(2-hydroxyphenyl)-benz-1,3-oxadiazolato)zinc]

PBD [2-(4-biphenylyl)-5-(4-tert-butyl-phenyl)-1,3,4-oxadiazole]

TAZ [3-(4-biphenylyl)-4-phenyl-5-tert-butylphenyl-1,2,4-triazole]

Liq[8-Quinolinolato Lithium]

Mgq2 [Bis(8-Quinolinolato) Magnesium]

Znq2 [Bis(8-Quinolinolato) Zinc]

FIG.10

| Al(Cathode)-150nm |
|---|
| LiF(EIL)-0.5nm |
| Balq:Alq3-35nm |
| Alq3+Co545T(EML)-25nm |
| NPD(HTL)-35nm |
| CuPC(HIL)-25nm |
| ITO(Anode)-150nm |
| Substrate |

FIG.13

| Al(Cathode)-150nm |
|---|
| LiF(EIL)-0.5nm |
| Balq:BeBq2-35nm |
| Alq3+Co545T(EML)-25nm |
| NPD(HTL)-35nm |
| CuPC(HIL)-25nm |
| ITO(Anode)-150nm |
| Substrate |

ORGANIC ELECTROLUMINESCENCE DEVICE AND METHOD FOR FABRICATING THE SAME

This application claims the benefit of Korean Patent Application No. 10-2005-0067301, filed on Jul. 25, 2005, which is hereby incorporated by reference as if fully set forth herein.

BACKGROUND OF THE INVENTION

1. Field of the Invention

The present invention relates to an organic electroluminescent (EL) device, and more particularly, to an organic electroluminescent device having an electron-transport layer and a method for fabricating the same.

2. Background of the Related Art

Generally, an organic electroluminescent (EL) device includes a stack of organic layers, each layer having a function related to an anode made of materials such as indium tin oxide (ITO) and a cathode made of materials such as aluminum (Al). An electric field is applied to the stack to emit light. Organic EL devices are characterized by the capability to be driven at a low voltage with relatively low consumption of electric power, while having a light-weight and flexible substrate.

Conventional organic EL devices exhibit significant variation in service life and efficiency, depending upon materials and stack structures used therein, as well as surface treatment conditions of anodes. Although significant effort has been expended in trying to improve service life and efficiency of conventional organic EL devices, substantially no satisfactory results have been achieved, and service life and efficiency of organic EL devices remain a problem.

SUMMARY OF THE INVENTION

An object of the invention is to solve at least the above problems and/or disadvantages and to provide at least the advantages described hereinafter.

Accordingly, the present invention is directed to an organic electroluminescent device and a method for fabricating the same that substantially obviate one or more problems due to limitations and disadvantages of the related art.

An object of the present invention is to provide an organic electroluminescent device having an improved service life and efficiency via formation of an electron-transport layer utilizing a novel material, and a method for fabricating the same.

Another object of the present invention is to provide an organic electroluminescent device involving a simplified manufacturing process via formation of an electron-transport layer utilizing a novel material, and a method for fabricating the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the invention, as embodied and broadly described herein, an organic electroluminescent device includes a stack structure including an emitting layer and an electron-transport layer between an anode and a cathode, wherein the electron-transport layer is a mixture of at least two materials, and the mixture of at least two materials may be a mixture of an organic compound and one or more other organic compounds, or may be a mixture of a metal or inorganic compound and one or more other metal or inorganic compounds, or may be a mixture of one or more organic compounds and one or more metal or inorganic compounds.

The electron-transport layer may be a mixture of a first material and a second material, and a composition ratio of the first material (X) to the second material (Y) may be in the range of 1-100:1 and 1:1-100.

In addition, the electron-transport layer may be a mixture of a first material and plural materials, and a composition ratio of the first material (X) to the plural materials (Y) may be in the range of 1-100:1 and 1:1-100.

The electron-transport layer may contain at least one material having hole-blocking properties and at least one material having electron-transporting properties.

Herein, the material having hole-blocking properties may have an oxidation potential greater than 0.4V, and an absolute value of the Highest Occupied Molecular Orbital (HOMO) greater than 5.2 eV.

Meanwhile, the material having electron-transporting properties may have a mobility of more than $1.0 \times 10^{-6}$ cm$^2$/Vs.

In addition, the electron-transport layer may contain at least one material having hole-blocking properties, at least one material having electron-transporting properties and at least one material having electron injection- or electron-transport-facilitating properties.

In another aspect of the present invention as embodied and broadly described herein, a full-color organic electroluminescent (EL) device may include a stack structure including an emitting layer and an electron-transport layer between an anode and a cathode, wherein the emitting layer contains at least one phosphorescent material, and wherein the electron-transport layer may be a mixture of at least one material having hole-blocking properties and at least one material having electron-transporting properties.

In a further aspect of the present invention as embodied and broadly described herein, an organic electroluminescent device may include a multiplicity of light-emitting units including an emitting layer and an electron-transport layer between an anode and a cathode, wherein the adjacent emitting units are separated by interlayers, and wherein the electron-transport layer may be a mixture of at least one material having hole-blocking properties and at least one material having electron-transporting properties.

Herein, the light-emitting units may be made up of the same stack structures or different stack structures.

In yet another aspect of the present invention as embodied and broadly described herein, a method for fabricating an organic electroluminescent device includes forming a first electrode on a substrate, forming an emitting layer containing at least one phosphorescent material on the first electrode, forming, over the entire emitting layer, an electron-transport layer including a mixture of at least one material having hole-blocking properties and at least one material having electron-transporting properties, and forming a second electrode on the electron-transport layer.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements, wherein:

FIG. 10 is a sectional view of an organic EL device having a Balq:Alq$_3$ electron-transport layer;

FIG. 13 is a sectional view of an organic EL device having a Balq:BeBq$_2$ electron-transport layer;

DETAILED DESCRIPTION OF PREFERRED EMBODIMENTS

Figure 1A:
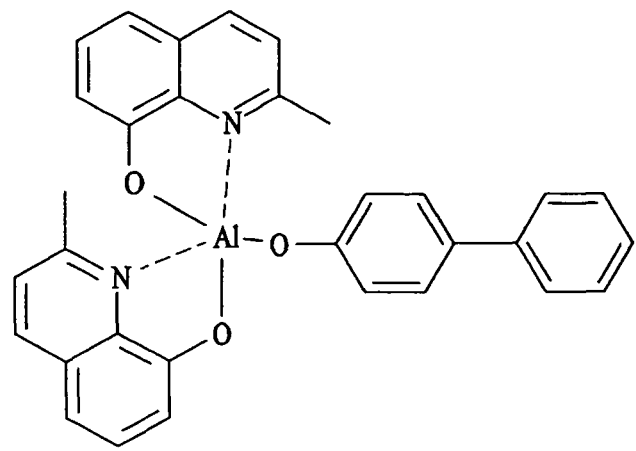
FIGS. 1a to 1e are structural formulae of hole-blocking materials used in an electron-transport layer of an organic EL device in accordance with an embodiment of the invention.
Figure 1B:
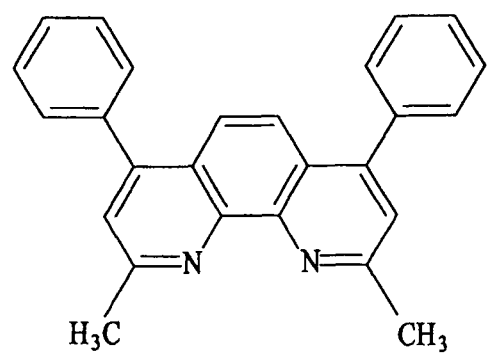
Figure 1C:
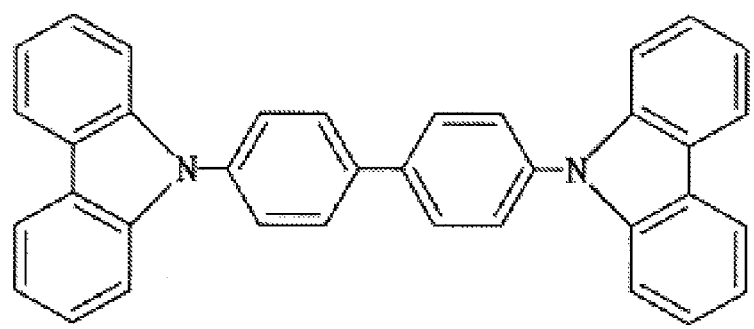
Figure 1D:
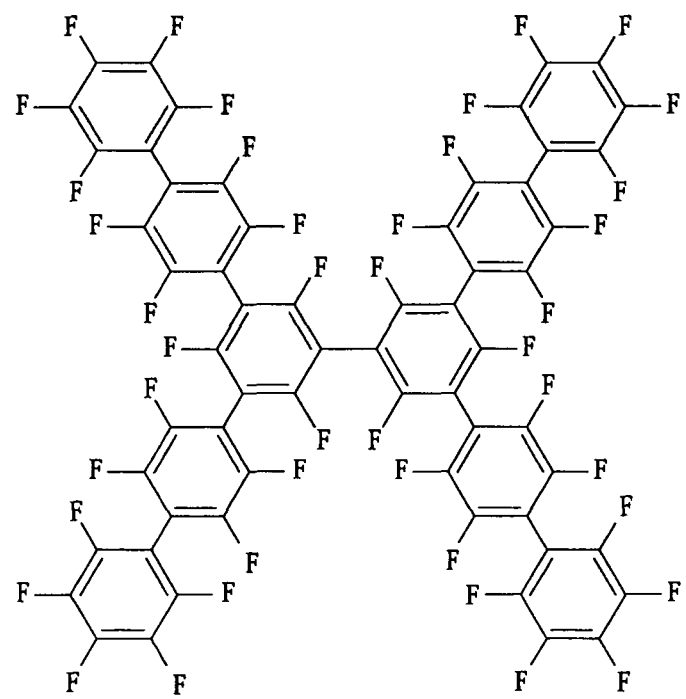
Figure 1E:
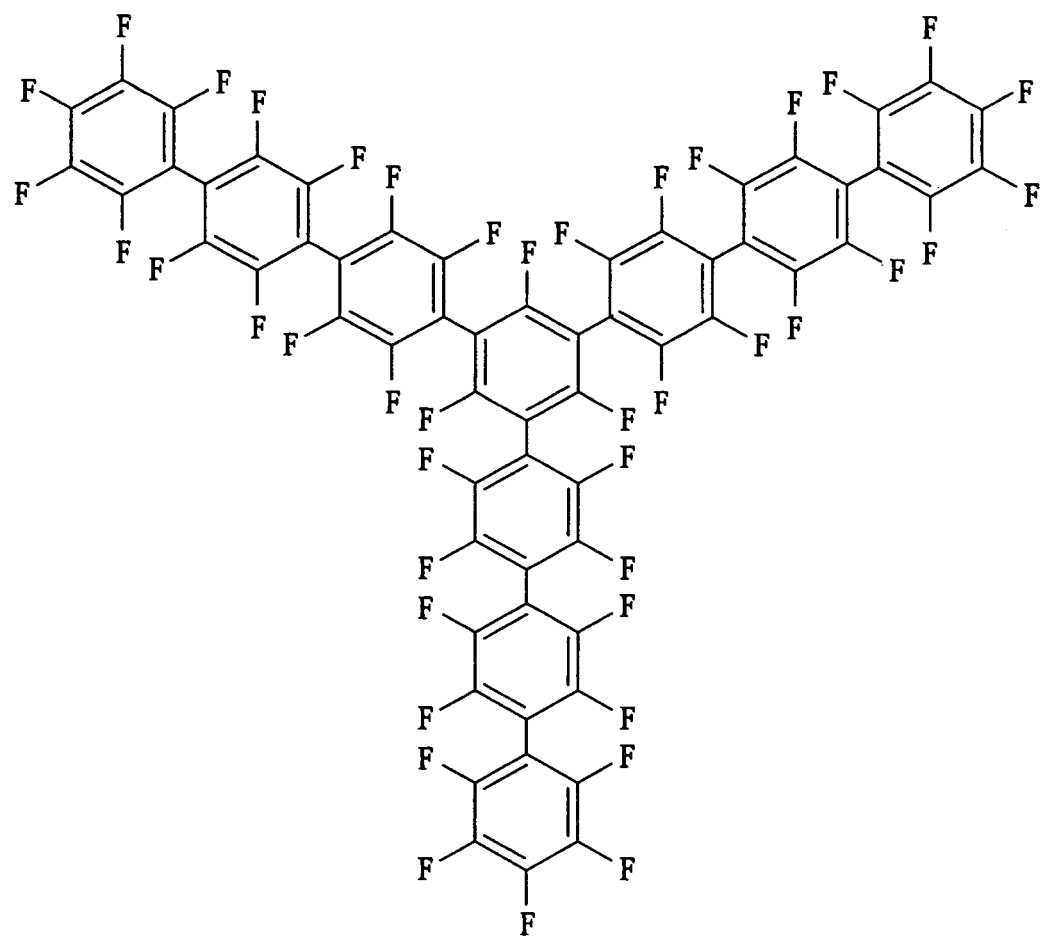
Figure 2A:
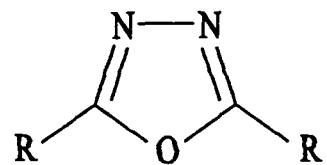
FIGS. 2a to 2h are structural formulae of derivatives used in an electron-transport layer of an organic EL device in accordance with an embodiment of the invention.
Figure 2B:
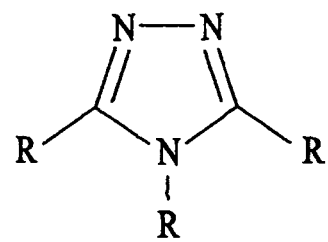
Figure 2C:
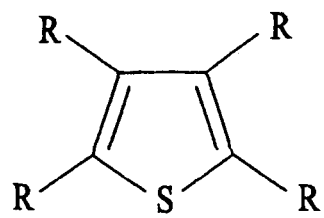
Figure 2D:
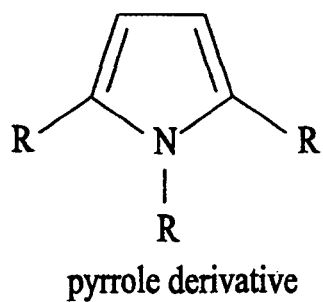
Figure 2E:
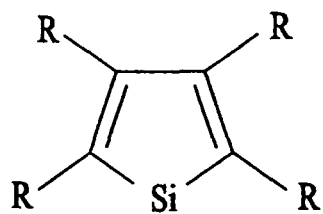
Figure 2F:
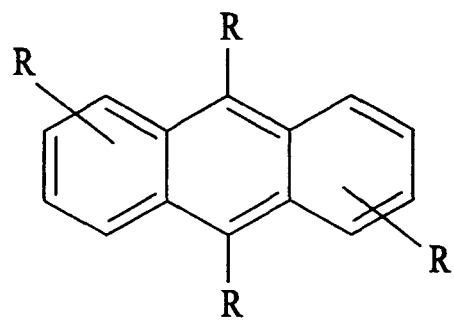
Figure 2G:
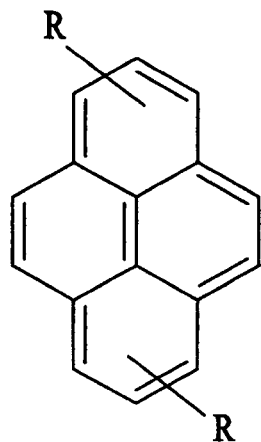
Figure 2H:
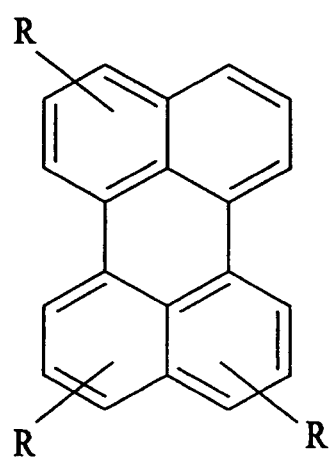
Figure 3A:
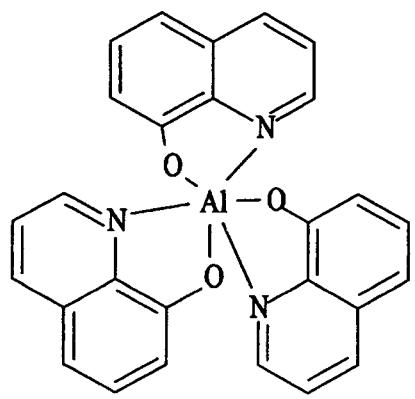
FIGS. 3a to 3h are structural formulae of electron-transporting materials used in an electron-transport layer of an organic EL device in accordance with an embodiment of the invention.
Figure 3B:
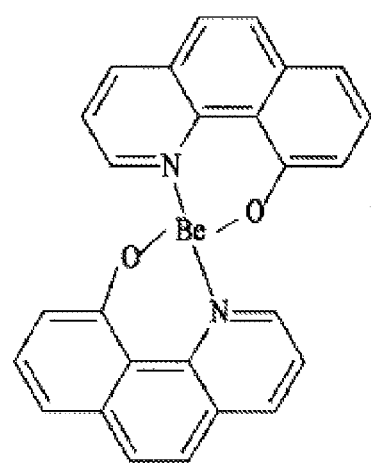
Figure 3C:
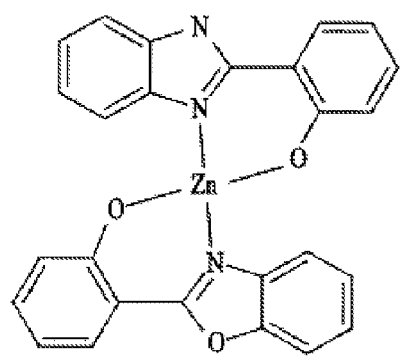
Figure 3D:
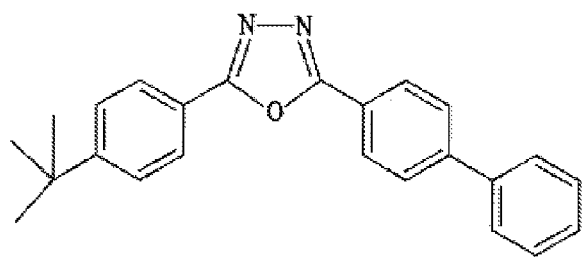
Figure 3E:
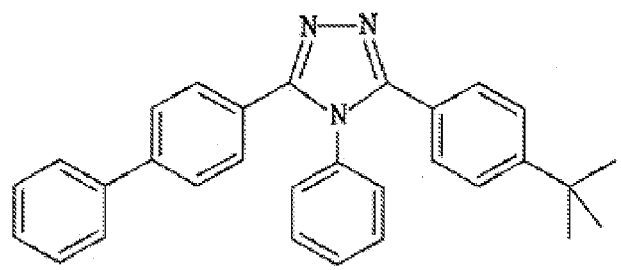
Figure 3F:
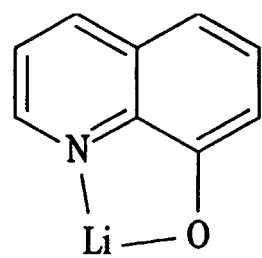
Figure 3G:
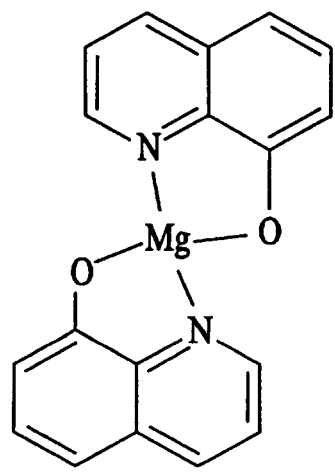
Figure 3H:
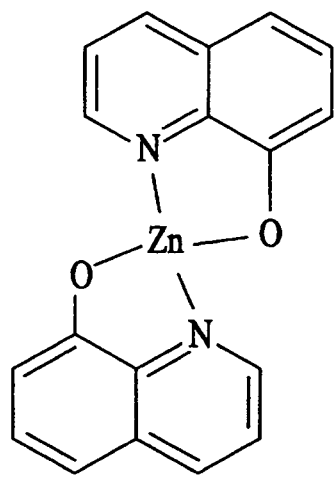

Reference will now be made in detail to the preferred embodiments of the present invention, examples of which are illustrated in the accompanying drawings. Wherever possible, the same reference numbers will be used throughout the drawings to refer to the same or like parts.

An organic electroluminescent (EL) device generates light of a certain wavelength via formation of excitons resulting from recombination between electrons and holes, injected via a cathode and an anode, in an emitting layer. A structure in which a hole-transport layer is inserted between the anode and emitting layer, and an electron-transport layer is inserted between the cathode and emitting layer. This structure is highly efficient because an area for light-emitting via recombination between the electrons and holes is confined within the emitting layer.

Additionally, in order to obtain optimal luminous efficiency of the device, it is also important to adjust a balance between holes and electrons, such that carriers injected into the emitting layer are excited proximate the center of the emitting layer. For this purpose, it is possible to attain optimal efficiency by adjusting thicknesses of the respective stacked layers, taking into account transport capability of the hole-transport layer and electron-transport layer.

Conventionally, when applying a forward voltage to the organic EL device, holes from an anode are injected into the emitting layer and electrons from a cathode are injected into the emitting layer, resulting in recombination between holes and electrons in the emitting layer, thereby emitting light. An Internal Quantum Efficiency of the organic EL device is expressed by the ratio of the number of photons generated inside the device to the number of charges injected from the external electrode.

That is, Internal Quantum Efficiency ($\eta$int) is expressed by the following equation:

$$\eta int = \gamma \eta r \eta f \qquad \text{(Eqn. 1)}$$

wherein $\gamma$ is a factor related to a balance between electron and hole injection, $\eta r$ is a generation efficiency of singlet excitons by electron-hole recombination, and $\eta f$ is an emission quantum efficiency of singlet excitons.

When recombination between electrons and holes, each having a spin S=½, forms excitons in the emitting layer, there occurs a triplet state having S=1 in which two spins are symmetrically arranged and a singlet state having S=0 in which two spins are anti-symmetrically arranged, in a ratio of 3:1. A ground state of most molecules is a spin singlet state.

As such, according to selection rules, singlet excitons are allowed for radiative transition to the ground state, which is called fluorescence. Radiative transition of triplet excitons, emitting light, into a singlet-ground state is preferably prohibited. Triplet excitons may also undergo transition through light emission by perturbation such as spin-orbit coupling, which is called phosphorescence.

In phosphorescent or fluorescent organic EL devices, the balance between electron and hole injection is preferably maintained in order to obtain maximum efficiency thereof. This balance factor, $\gamma$, is referred to as a charge balance factor.

In most conventional organic EL devices, holes are injected into the emitting layer in excessive numbers compared to the number of electrons. Such injection of excessive numbers of holes leads to a decrease in efficiency of the device. When holes injected into the emitting layer are blocked to prevent such phenomena, this causes a rise in voltage on the corresponding I-V curve in most cases. Thus, an electron-transport layer which is capable of maximizing injection of electrons into the emitting layer and is capable of appropriately blocking holes injected into the emitting layer is needed.

An organic EL device in accordance with an embodiment of the invention primarily comprises a substrate, a first electrode formed on the substrate, an emitting layer formed on the first electrode, a second electrode formed on the emitting layer, and an electron-transport layer formed on at least one region, i.e., between the first electrode and emitting layer and between the second electrode and emitting layer. Any one of the first electrode and second electrode may be an anode or cathode formed of a transparent material.

The electron-transport layer may include a mixture of at least two materials, and the mixture may be a mixture of at least two materials selected from an organic compound, a metal compound and an inorganic compound. More specifically, the electron-transport layer may be a mixture of an organic compound and one or more other organic compounds, or may be a mixture of a metal or inorganic compound and one or more other metal or inorganic compounds, or may be a mixture of one or more organic compounds and one or more metal or inorganic compounds.

Preferably, the electron-transport layer has a thickness of between approximately 0.1 and 500 nm.

The electron-transport layer may be a mixture of a first material and a second material, wherein a composition ratio of the first material N and the second material (Y) is in the range of 1-100:1 and 1:1-100. Additionally, when the electron-transport layer is instead a mixture of a first material and plural materials, a composition ratio of the first material (X) to the plural materials (Z) may be in the range of between approximately 1-100:1 and 1:1-100.

Preferably, electron-transport layer includes at least one material having hole-blocking properties and at least one material having electron-transporting properties. The material having hole-blocking properties preferably has an oxidation potential greater than approximately 0.4V, and an absolute value of the Highest Occupied Molecular Orbital (HOMO) greater than approximately 5.2 eV. Generally, since the absolute value of the HOMO is about 5.2 eV for a green dopant, about 5 eV for a red dopant, and more than about 5.1 eV for a blue dopant, a material having the absolute value of the HOMO of more than about 5.2 eV is preferably utilized as the hole-blocking material and serves to block holes and excitons formed in the emitting layer.

The hole-blocking material may be a metal complex containing materials such as, for example, a substituted or unsubstituted 8-hydroxyquinoline, and the metal may be selected from metals such as, for example, aluminum (Al), zinc (Zn), magnesium (Mg) and lithium (Li). Other materials may also be appropriate. Alternatively, the hole-blocking material may be a substituted or unsubstituted 1,10-phenanthroline derivative, or may be a substituted or unsubstituted carbazole derivative.

The hole-blocking material, as shown in FIGS. 1a through 1e, may be selected from materials such as, for example, Balq (aluminum(III) bis(2-methyl-8-quinolinato) 4-phenylphenolate), BCP (2,9-dimethyl-4,7-diphenyl-1,10-phenanthroline), CBP [4,4'-N,N'-dicarbazole-1,1'-biphenyl], CF-X and CF-Y. Other materials may also be appropriate.

Preferably, the material having electron-transporting properties has a mobility of more than approximately $1.0 \times 10^{-6}$ cm$^2$/Vs. Other levels of mobility may also be appropriate, based on the material selected.

The material having electron-transporting properties, as shown in FIGS. 2a through 2h, may be selected from materials such as, for example, a substituted or unsubstituted aluminum (Al) complex, a substituted or unsubstituted beryllium (Be) complex, a substituted or unsubstituted zinc (Zn) complex, a substituted or unsubstituted oxidiazole derivative, a substituted or unsubstituted triazole derivative, a substituted or unsubstituted thiophene derivative, a substituted or unsubstituted pyrrole derivative, a substituted or unsubstituted silacyclopentadiene derivative, a substituted or unsubstituted anthracene derivative, a substituted or unsubstituted pyrene derivative and a substituted or unsubstituted perylene derivative. Other materials may also be appropriate.

Alternatively, the material having electron-transporting properties, as shown in FIGS. 3a through 3h, may be selected from materials such as, for example, Alq$_3$ [Tris-(8-hydroxyquinolinato)-aluminum], BeBq$_2$ [Bis(10-hydroxybenzo[h]quinolinato)beryllium], Zn(oxz)$_2$ [Bis(2-(2-hydroxyphenyl)-benz-1,3-oxadiazolato)zinc], PBD [2-(4-biphenylyl)-5-(4-tert-butyl-phenyl)-1,3,4-oxadiazole], TAZ [3-(4-biphenylyl)-4-phenyl-5-tert-butylphenyl-1,2,4-triazole], Liq [8-quinolinolato lithium], Mgq$_2$ [Bis(8-quinolinolato)magnesium] and Znq$_2$ [Bis(8-quinolinolato)zinc]. Other materials may also be appropriate.

Meanwhile, where the electron-transport layer in accordance with the present invention may include at least one organic compound or at least one organic metal compound, the organic compound or organic metal compound may be a phthalocyanine derivative and a metallophthalocyanine derivative, wherein a metal component may include any one of Co, AlCl, Cu, Li$_2$, Fe, Pb, Mg, Na$_2$, Sn, Zn, Ni, Mn, VO, Ag$_2$, MnCl, SiCl$_2$ and SnCl$_2$, or the organic compound or organic metal compound may be a porphyrin derivative and a metalloporphyrin derivative, wherein a metal component may include any one of Co, AlCl, Cu, Li$_2$, Fe, Pb, Mg, Na$_2$, Sn, Zn, Ni, Mn, VO, Ag$_2$, MnCl, SiCl$_2$ and SnCl$_2$.

Additionally, the electron-transport layer may include at least one material having hole-blocking properties, at least one material having electron-transporting properties, and at least one material having electron-injection-facilitating properties or electron-transport-facilitating properties. The material having electron-injection-facilitating properties or electron-transport-facilitating properties may be an inorganic compound or a metal.

Such an inorganic compound may be selected from compounds such as, for example, alkaline metal compounds, alkaline earth metal compounds, earth metal compounds and lanthanide compounds. More specifically, the inorganic compound may be selected from halide compounds such as, for example, LiF, NaF, KF, RbF, CsF, FrF, MgF$_2$, CaF$_2$, SrF$_2$, BaF$_2$, LiCl, NaCl, KCl, RbCl, CsCl and FrCl, and oxides such as, for example, Li$_2$O, Li$_2$O$_2$, Na$_2$O, K$_2$O, Rb$_2$O, Rb$_2$O$_2$, Cs$_2$O, Cs$_2$O$_2$, LiAlO$_2$, LiBO$_2$, LiTaO$_3$, LiNbO$_3$, LiWO$_4$, Li$_2$CO, NaWO$_4$, KalO$_2$, K$_2$SiO$_3$, B$_2$O$_5$, Al$_2$O$_3$ and SiO$_2$. Other compounds may also be appropriate.

The metal may be selected from metals such as, for example, alkaline metals, alkaline earth metals, earth metals, rare earth metals and alloys thereof. More specifically, the metal may be selected from Li, Na, K, Cs, Be, Mg, Ca, Sr, Ba, Y, La, Ce, Sm, Gd, Eb, Yb, an Al:Li alloy, a Mg:Sr alloy and an In:Li alloy. Other metals may also be appropriate.

In this manner, an electron-transport layer made up of a novel material can be applied to various structures of organic EL devices in order to improve efficiency and service life of the devices.

FIGS. 4 to 7 are sectional views of organic EL devices in accordance with the first to fourth embodiments of the present invention.

Figure 4:
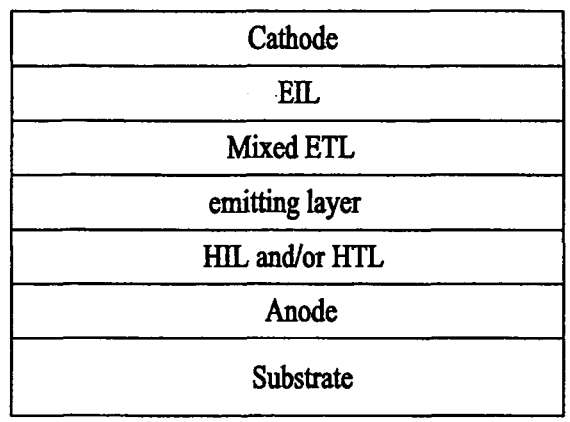
FIGS. 4 to 7 are sectional views of organic EL devices in accordance with embodiments of the invention.
Figure 5:
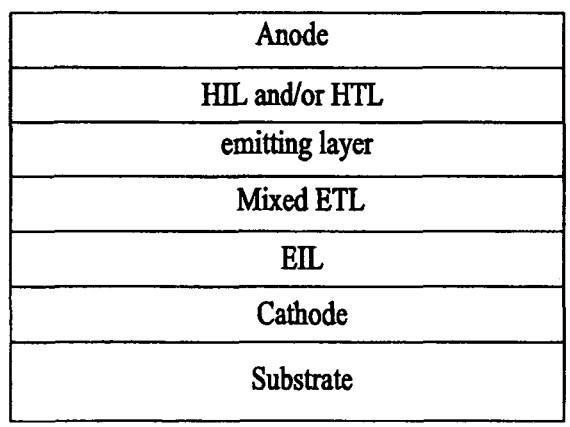
Figure 6:
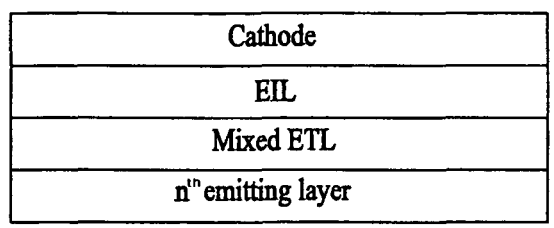
Figure 6:
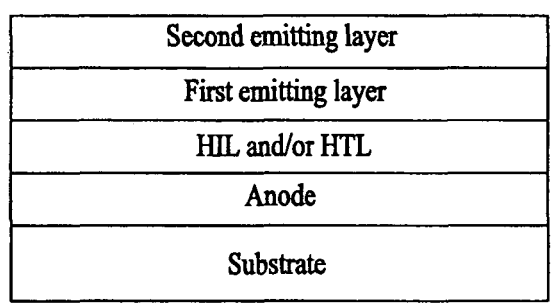

As shown in FIGS. 4 and 5, at least one of a hole-injection layer and a hole-transport layer may be formed between the anode and emitting layer, and an electron-injection layer may be formed between the cathode and electron-transport layer. Additionally, at least one phosphorescent material may be included in the emitting layer. Further, as shown in FIG. 6, the emitting layer may be formed of plural layers. As such, in accordance with the present invention, it is possible to fabricate various structures of organic EL devices which have improved efficiency and service life.

Figure 7:
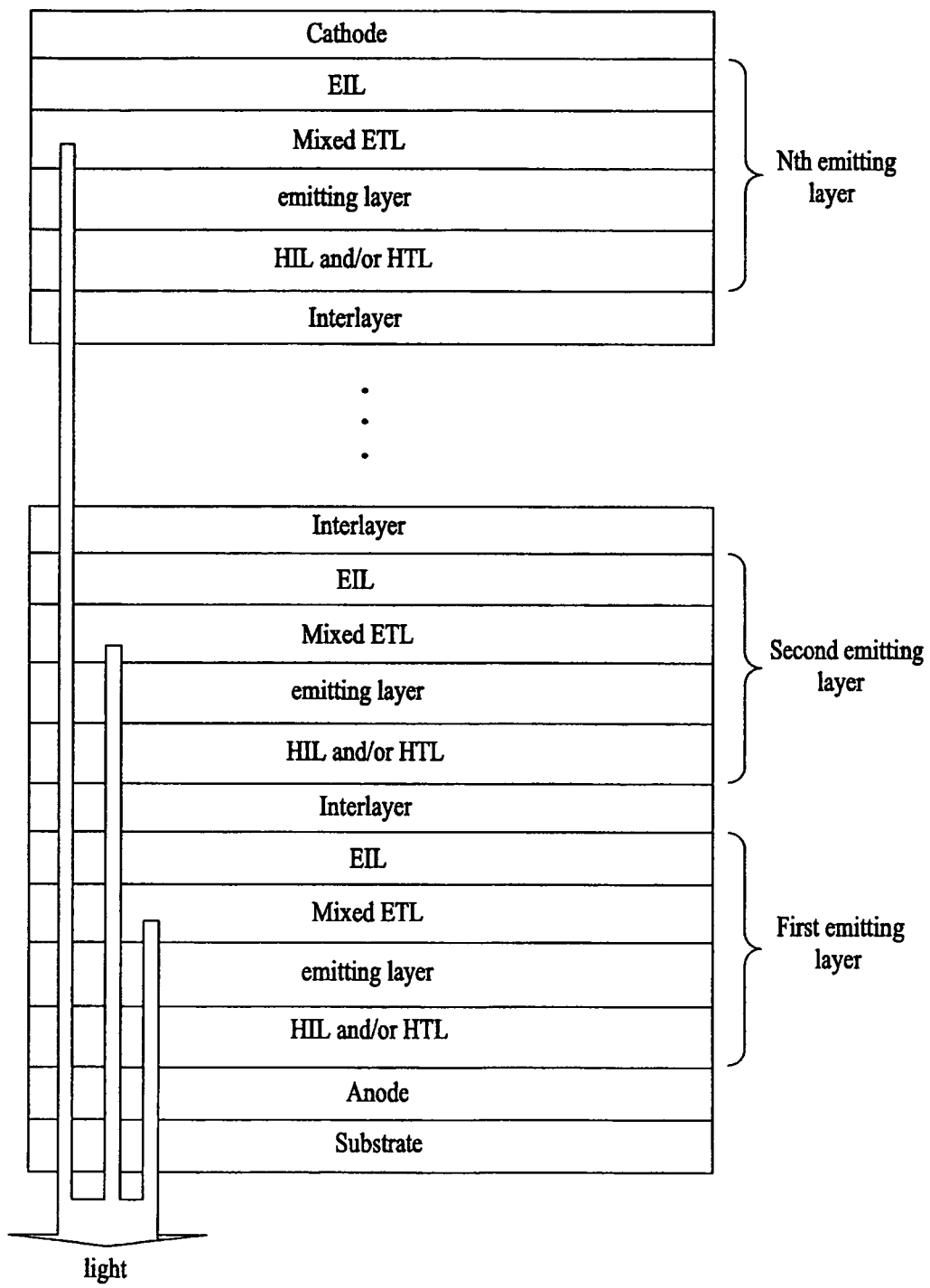

A multi-structure fabrication of an organic EL device is shown in FIG. 7.

In this configuration, the organic EL device has a multitude of light-emitting units, each including an emitting layer and an electron-transport layer between an anode and a cathode, with adjacent emitting units separated by interlayers.

Each of light-emitting units includes an electron-transport layer including a mixture of at least one material having hole-blocking properties and at least one material having electron-transporting properties. The light-emitting units may have the same stack structures, or may have different stack structures.

A fabrication process for an organic EL device in accordance with the present invention will now be described.

First, a first electrode is formed on a substrate, and an emitting layer containing at least one phosphorescent material is formed on the first electrode. Next, an electron-transport layer including a mixture of at least one material having hole-blocking properties and at least one material having electron-transporting properties is formed over substantially the entire emitting layer. Then, a second electrode is formed on the electron-transport layer. As such, in a device in which the emitting layer includes a phosphorescent material (a phosphorescent organic EL device), the electron-transport layer performs a hole-blocking function, and therefore a separate hole-blocking layer is not needed.

Therefore, the present invention provides a simplified manufacturing process through the formation of an electron-transport layer, without the need for a separate hole-blocking layer.

More particularly, upon fabricating a full-color organic electroluminescent device, where at least one of a red-emitting layer, a green-emitting layer and a blue-emitting layer is a fluorescent emitting layer and at least one of the remaining layers is a phosphorescent layer (a phosphorescent-fluorescent hybrid organic EL device), the present invention enables provision of a simplified manufacturing process by uniformly forming an electron-transport layer which performs a hole-blocking function throughout substantially the entire phosphorescent and fluorescent emitting layers, without formation of a separate hole-blocking layer on the phosphorescent emitting layers.

In order to examine characteristics of the organic EL device in accordance with the present invention thus fabricated, characteristics of IVL were compared between $Alq_3$, which is used as a conventional material for an electron-transport layer, and Balq [aluminum(III) bis(2-methyl-8-quinolinato) 4-phenylphenolate], which is used as a hole-blocking material.

EXAMPLES

The present invention will be described in more detail with reference to the following examples. These examples are provided for illustrative purposes only, and should not be construed as limiting the scope and spirit of the present invention.

Example 1

1) An anode made of indium tin oxide (ITO) is formed on a transparent substrate, and a hole-injection layer (HIL) made of copper phthalocyanine (CuPc) is applied on the anode to a thickness of about 25 nm.

2) A hole transport layer (HTL) is formed by applying 4,4'-bis[N-(1-naphthyl)-N-phenyl-amino]biphenyl (NPD) on the HIL to a thickness of about 35 nm.

3) In order to prepare a green-emitting layer, 8-hydroxyquinoline aluminum ($Alq_3$), doped with about 1% C545T, is applied on the HTL to a thickness of about 25 nm.

4) $Alq_3$ Device A) or Balq (Device B) is applied on the emitting layer to a thickness of about 35 nm to form an electron-transport layer (ETL).

5) LiF is applied on the ETL to a thickness of about 0.5 nm to form an electron-injection layer (EIL).

6) Aluminum (Al) is applied on the EIL to a thickness of about 150 nm to form a cathode.

Figure 8:
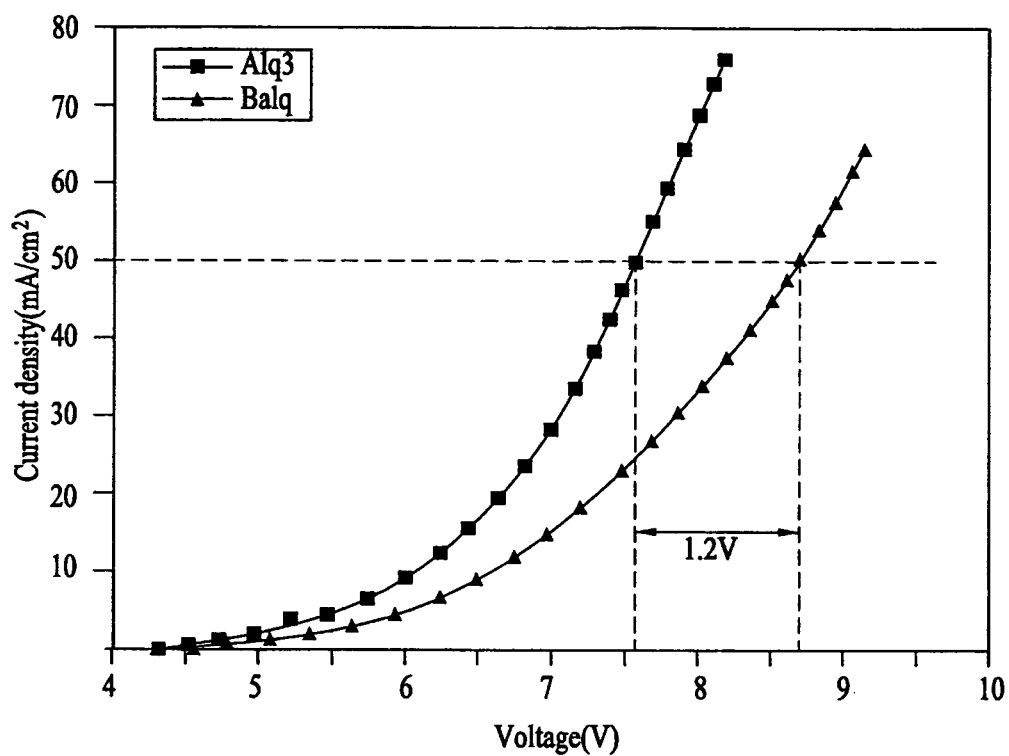
FIGS. 8 and 9 are graphs comparing IVL characteristics with respect to materials used in an electron-transport layer.
Figure 9:
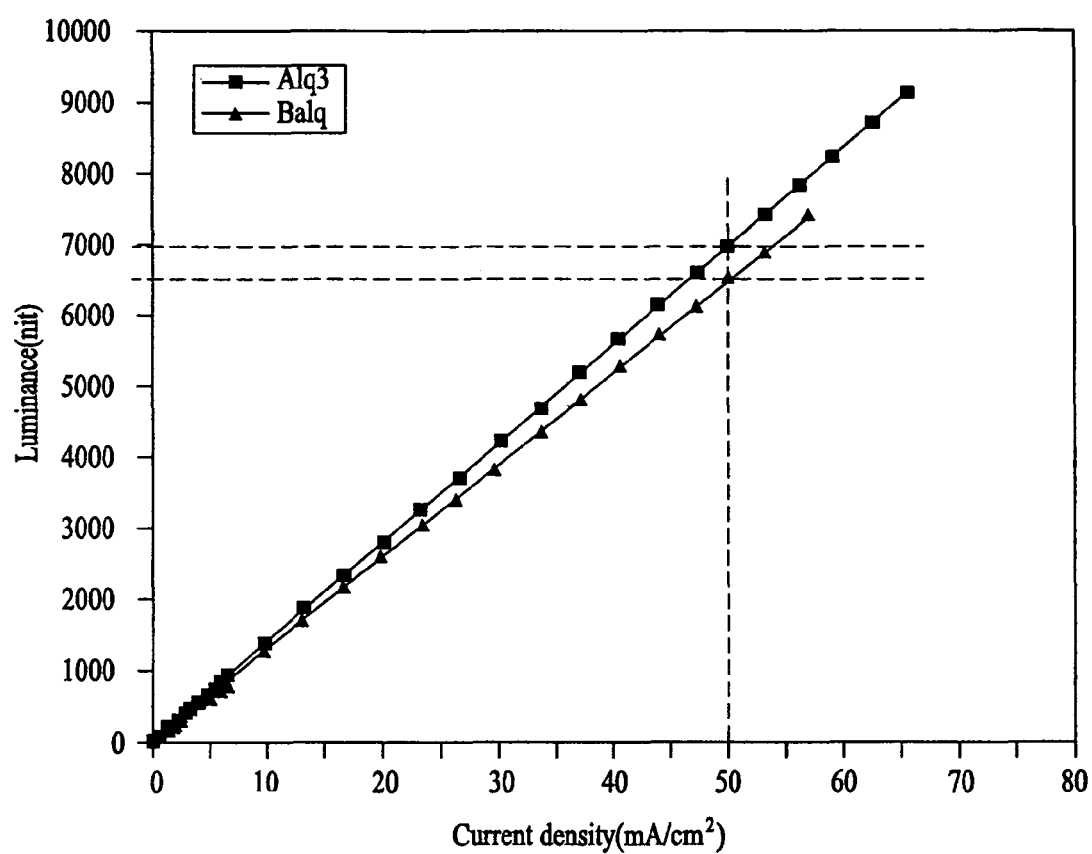

A comparison of IVL characteristics between the Device A and Device B as fabricated in this manner is shown in FIGS. 8 and 9. In Device A, where $Alq_3$ is used as the electron-transport layer, holes serve as majority carriers. Therefore, a large number of injected holes remain in the emitting layer. Balq may be used to block such holes, but exhibits lower electron mobility than when $Alq_3$ is used.

As shown in FIGS. 8 and 9, it can be seen that Device B, which uses Balq as the electron-transport layer, exhibits a voltage about 1.2 V higher than Device A, which uses $Alq_3$ as the electron-transport layer, on the I-V curve. Thus, even though a material having hole-blocking properties and electron-transporting properties is required, there is still a need for development of a material that satisfies both of these properties.

As such, the present invention has achieved improved efficiency of the organic EL device via adjustment of charge balance between holes and electrons in the emitting layer by maintaining an electron-transporting ability of the electron-transport layer while simultaneously blocking holes, through use of a mixture of a material having hole-blocking properties and a material having electron-transporting properties as the material for the electron-transport layer.

Example 2

FIG. 10 is a sectional view of an organic EL device in accordance with an embodiment of the invention, and is fabricated as described below.

1) An ITO anode is formed on a transparent substrate, and a hole-injection layer (HIL) made of copper phthalocyanine (CuPc) is applied on the anode to a thickness of about 25 nm.

2) A hole-transport layer (HTL) is formed by applying 4,4'-bis[N-(1-naphthyl)-N-phenyl-amino]biphenyl (NPD) on the HIL to a thickness of about 35 nm.

3) In order to prepare a green-emitting layer, 8-hydroxyquinoline aluminum ($Alq_3$), doped with about 1% C545T, is applied on the HTL to a thickness of about 25 nm.

4) An electron-transport layer (ETL) is formed by applying $Alq_3$ having superior electron mobility and Balq having superior hole blocking ability on the emitting layer to a thickness of about 35 nm, in a 3:7 vol % ratio of Balq and $Alq_3$ (Device C), or in a 5:5 vol % ratio of Balq and $Alq_3$ Device D), or in a 7:3 vol % ratio of Balq and $Alq_3$ Device E).

5) Next, an electron-injection layer (EIL) is formed by applying LiF to a thickness of about 0.5 nm on the ETL.

6) Next, a cathode is formed by applying aluminum (Al) to a thickness of about 150 nm on the EIL.

Figure 11:
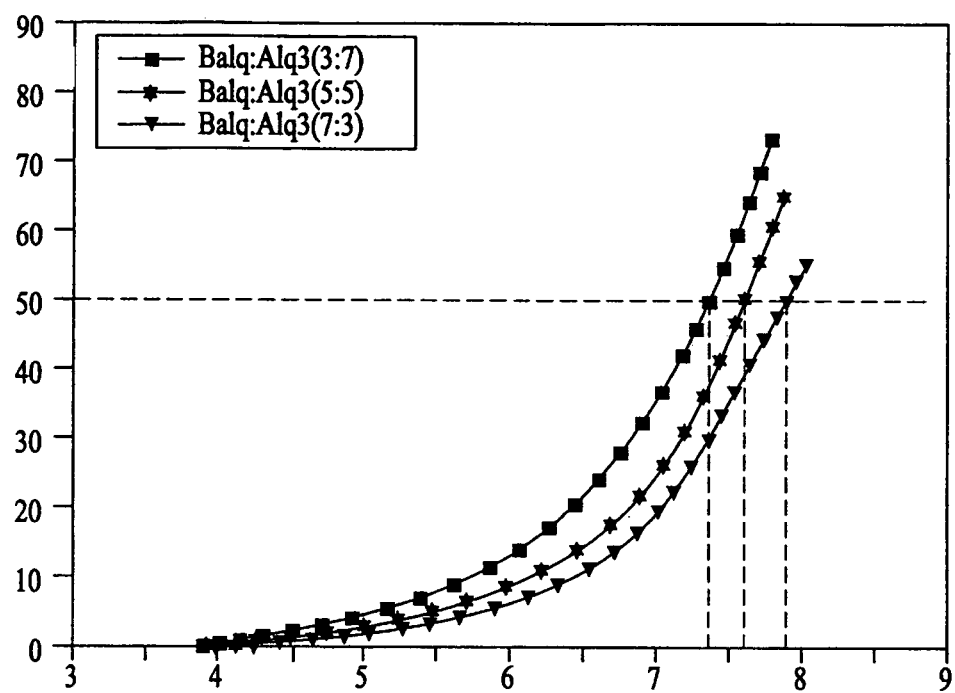
FIGS. 11 and 12 are graphs comparing characteristics of IVL with respect to a composition ratio of a Balq:Alq$_3$ electron-transport layer.
Figure 12:
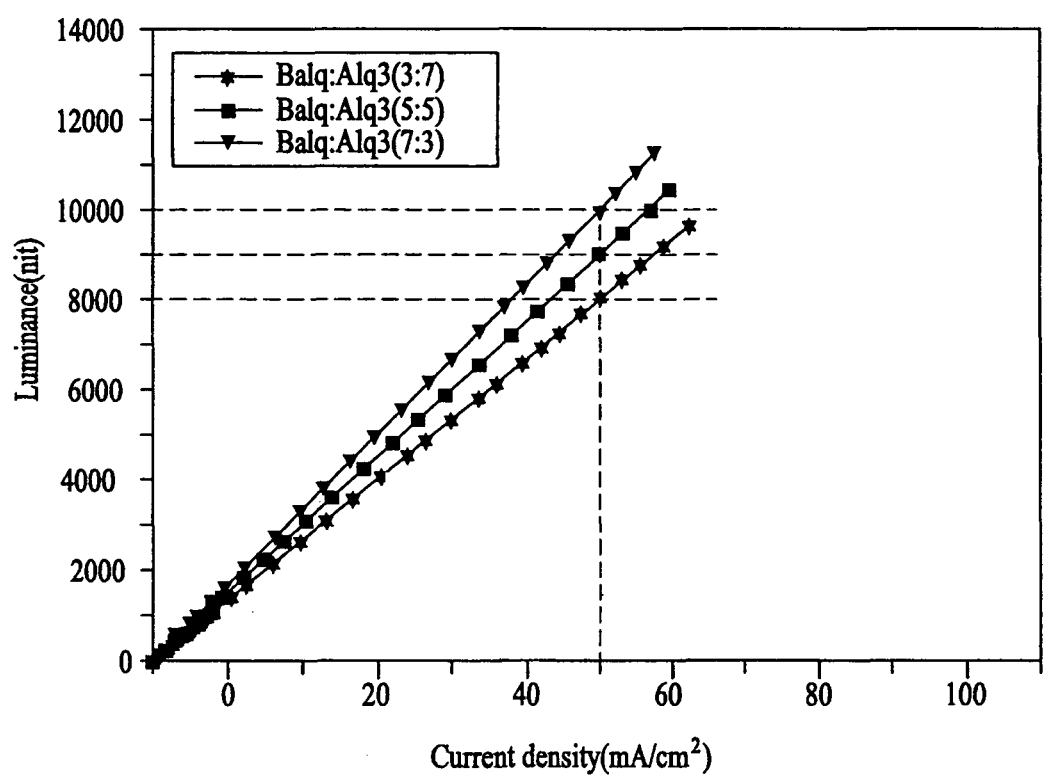

A comparison of IVL characteristics between the thus-fabricated Devices C, D and E is shown in FIGS. 11 and 12. As can be seen from FIGS. 11 and 12, Device C (Balq:$Alq_3$=3:7) exhibited poor I-L characteristics, but exhibited I-V characteristics similar to Device A using $Alq_3$ alone. Device E (Balq:$Alq_3$=7:3) exhibited superior I-L characteristics while exhibiting the lowest I-V characteristics among three devices, but it can be seen that Device E has an improved voltage as compared to Device B using Balq alone, which was exemplified in Example 1.

Thus, it is possible to increase efficiency of an organic EL device by confining holes, which were injected into the emitting layer through the hole-transport layer from the anode (ITO), within the emitting layer, via suitable incorporation of an appropriate material having hole-blocking properties into the electron-transport layer of the organic EL device.

Table 1 below shows comparison of characteristics between the respective devices at a current density of 50 $mA/cm^2$.

TABLE 1

| | ETL | Voltage (V) | Luminance (nit) | cd/A | lm/W | Efficiency (%) |
|---|---|---|---|---|---|---|
| Device A | $Alq_3$ | 7.5 | 6712 | 13.4 | 5.6 | Ref |
| Device B | Balq | 8.7 | 6454 | 12.9 | 4.7 | 83 |
| Device C | Balq:$Alq_3$ = 3:7 | 7.38 | 8155 | 16.3 | 6.9 | 123 |
| Device D | Balq:$Alq_3$ = 5:5 | 7.59 | 9118 | 18.2 | 7.5 | 134 |
| Device E | Balq:$Alq_3$ = 7:3 | 7.87 | 10080 | 20.2 | 8.0 | 143 |

Example 3

Hereinafter, another example of an electron-transport layer which may be utilized in the present invention will be described with respect to FIG. 13.

The device shown in FIG. 13 was fabricated using $BeBq_2$ as an electron-transporting material and Balq as a hole-blocking material. The electron-transporting capability of $BeBq_2$ is superior to that of $Alq_3$ as used previously, and thus performance of the device could be further enhanced.

1) First, an ITO anode is formed on a transparent substrate, and a hole-injection layer (HIL) is formed by applying copper phthalocyanine (CuPc) to a thickness of about 25 nm on the anode.

2) A hole-transport layer (HTL) is formed by applying 4,4'-bis[N-(1-naphthyl)-N-phenyl-amino]biphenyl (NPD) to a thickness of about 35 nm on the HIL.

3) In order to prepare a green-emitting layer, 8-hydroxyquinoline aluminum ($Alq_3$), doped with about 1% C545T, is applied on the HTL to a thickness of about 25 nm.

4) Next, an electron-transport layer (ETL) is formed by applying $BeBq_2$ having superior electron mobility and Balq having superior hole-blocking ability on the emitting layer to a thickness of about 35 nm, in a 5:5 vol % ratio of Balq and $BeBq_2$ (Device F).

5) Next, an electron-injection layer (EIL) is formed by applying LiF to a thickness of about 0.5 nm on the ETL.

6) Next, a cathode is formed by applying aluminum (Al) to a thickness of about 150 nm on the EIL.

Table 2 below shows comparison of characteristics between the respective devices at a current density of 50 $mA/cm^2$.

TABLE 2

| | ETL | Voltage (V) | Luminance (nit) | cd/A | lm/W | Efficiency (%) |
|---|---|---|---|---|---|---|
| Device A | $Alq_3$ | 7.5 | 6712 | 13.4 | 5.6 | Ref |
| Device D | $Balq:Alq_3$ = 5:5 | 7.59 | 9118 | 18.2 | 7.5 | 134 |
| Device F | $Balq:BeBq_2$ = 5:5 | 6.7 | 10532 | 21.1 | 9.9 | 176 |

As can be seen from Table 2, Device F, using a mixture of Balq and $BeBq_2$ as the ETL, exhibited a 0.8V improvement in I-V characteristics and about 3820 nit improvement in I-L characteristics, as compared to Device A. As a result, power efficiency of Device F was improved by 176% as compared to a reference value of Device A.

Figure 14:
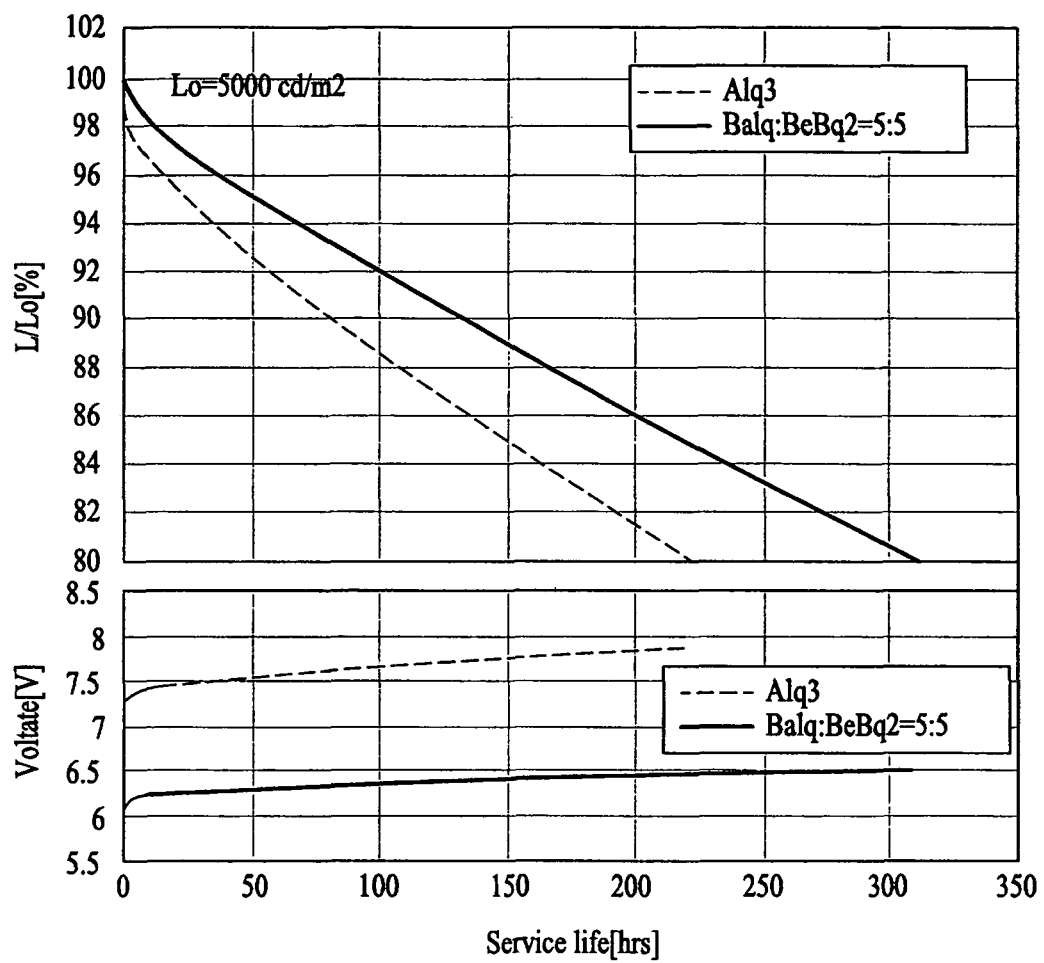
FIG. 14 is a graph comparing service lives of devices with respect to materials used in an electron-transport layer.

FIG. 14 is a comparison of service lives between Device A and Device F. As shown in FIG. 14, the service life of Device F at the same luminance of 5,000 nit is significantly improved as compared to Device A.

Hereinafter, an example will be discussed in which the electron-transport layer utilized in the present invention is applied to a phosphorescent organic EL device.

Generally, formation of excitons via recombination between electrons and holes, each having a spin S=½, in the emitting layer, results in occurrence of a triplet state having S=1 in which two spins are symmetrically arranged and a singlet state having S=0 in which two spins are anti-symmetrically arranged, in a ratio of 3:1. A ground state of most molecules is a spin singlet state.

Therefore, according to selection rules, singlet excitons may be allowed for radiative transition to the ground state, which is called fluorescence. Radiative transition of triplet excitons, emitting light, into a singlet ground state is preferably prohibited. Triplet excitons may also undergo transition through light emission by perturbation such as spin-orbit coupling, which is called phosphorescence.

Phosphorescent devices accomplish emission of light utilizing triplet excitons. In order to confine triplet excitons within the emitting layer such that triplet excitons formed in the emitting layer do not migrate to the cathode, the hole-blocking layer may be used next to the emitting layer. That is, the phosphorescent organic EL device may employ two layers, the hole-blocking layer and the electron-transport layer, capable of confining triplet excitons, next to the emitting layer. However, if an electron-transport layer capable of performing both functions as mentioned above is employed, there is no need for an additional hole-blocking layer.

Example 4

Figure 15:
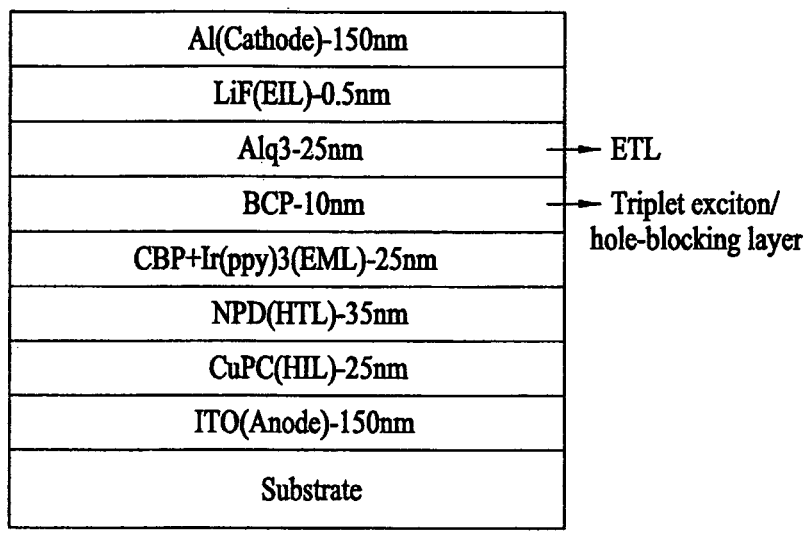
FIGS. 15 and 16 are sectional views of an organic EL device illustrating characteristics of the invention.
Figure 16:
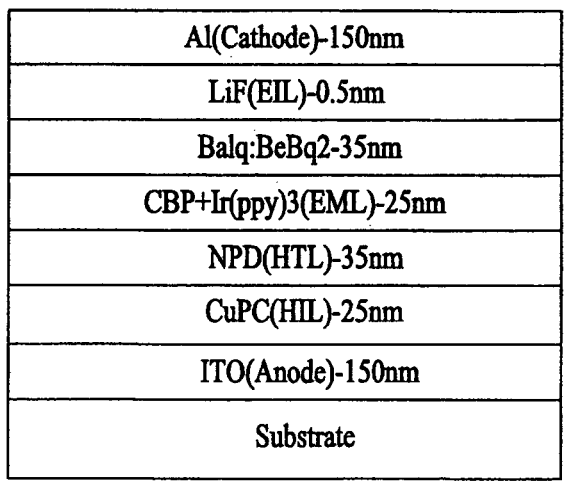

FIGS. 15 and 16 are sectional views of organic EL devices in accordance with embodiments of the invention. Fabrication of the device shown in FIG. 15 will first be discussed.

1) First, an ITO anode is formed on a transparent substrate, and a hole-injection layer (HIL) made of copper phthalocyanine (CuPc) is applied on the anode to a thickness of about 25 nm.

2) A hole-transport layer (HTL) is formed by applying 4,4'-bis[N-(1-naphthyl)-N-phenyl-amino]biphenyl (NPD) on the HIL to a thickness of about 35 nm.

3) In order to prepare a phosphorescent green-emitting layer, 4,4'-N,N'-dicarbazole-1,1'-biphenyl (CBP), doped with about 8% tris(2-phenylpyridine)iridium [$Ir(ppy)_3$], is applied on the HTL to a thickness of about 25 nm.

4) Next, 2,9-dimethyl-4,7-diphenyl 1,10-phenanthroline [BCP] is applied to a thickness of about 10 nm to form a triplet exciton-blocking material, and $Alq_3$ is applied to a thickness of about 25 nm to form an electron-transport layer (ETL).

CBP+$Ir(ppy)_3$(8%)/BCP/$Alq_3$    Device G 25 nm 10 nm 25 nm

4) Otherwise, $BeBq_2$ having superior electron mobility and Balq having superior hole-blocking ability are applied to a thickness of about 35 nm, in a 5:5 vol % ratio of Balq and $BeBq_2$.

CBP+$Ir(ppy)_3$(8%)/Balq:$BeBq_2$=5:5    Device H 25 nm 35 nm

5) Next, an electron-injection layer (EIL) is formed by applying LiF on the ETL to a thickness of about 0.5 nm.

6) Next, a cathode is formed by applying aluminum (Al) on the EIL to a thickness of 150 nm.

Table 3 below shows comparison of characteristics between the respective devices at a current density of 25 $mA/cm^2$.

TABLE 3

| | ETL | Voltage (V) | Luminance (nit) | cd/A | lm/W | Efficiency (%) |
|---|---|---|---|---|---|---|
| Device G | BCP/$Alq_3$ | 8 | 6857 | 27.4 | 10.8 | Ref |
| Device H | Balq:$BeBq_2$ = 5:5 | 7.8 | 6702 | 26.8 | 10.8 | 100 |

As can be seen from Table 3, Device G and Device H can achieve the same characteristics (1 m/W). Therefore, the electron-transport layer utilized in the present invention advantageously provides a simplified manufacturing process and can achieve characteristics and efficiency comparable to the conventional device which must use a separate hole-blocking layer to achieve such results.

Fabrication of a full-color panel, referring to FIG. 16 will now be discussed. FIG. 16. shows a green-emitting device of an organic EL device of the present invention. Different color-emitting devices have the same structure of FIG. 16 except with different emitting materials in the EML (emitting material layer).

If all of red-, green- and blue-emitting devices utilize a fluorescent or phosphorescent material, the same electron-transport layers may be employed. However, if one or two devices of red-, green- and blue-emitting devices utilize a fluorescent or phosphorescent material, the device utilizing the phosphorescent material conventionally employs a blocking layer to block triplet excitons. As such, a device utilizing phosphorescent material and a device utilizing fluorescent material exhibit differences in the composition of their respective electron-transport layers which will be deposited next to their respective emitting layer.

Electron-transport layers for the respective devices may be deposited as follows.

For illustrative purposes, reference will be made to the following:

Green-phosphorescent device: CBP+Ir(ppy)$_3$/BCP(10 nm)/Alq$_3$(25 nm)
Red-fluorescent device: Alq$_3$+dcjtb/Alq$_3$(35 nm)
Blue-fluorescent device: DPVBi/Alq$_3$(35 nm)

As the present invention utilizes an electron-transport layer in which a hole-blocking material is incorporated, it is possible to simplify a manufacturing process via formation of a single electron-transport layer alone, without formation of electron-transport layers having different structures according to the respective corresponding emitting devices.

For illustrative purposes, reference will be made to the following:

Green-phosphorescent device: CBP+Ir(ppy)$_3$/Balq:BeBq$_2$=5:5(35 nm)
Red-fluorescent device: Alq$_3$+dcjtb/Balq:BeBq$_2$=5:5(35 nm)
Blue-fluorescent device: DPVBi/Balq:BeBq$_2$=5:5(35 nm)

As such, it is possible to simplify a manufacturing process and enhance efficiency of the device in phosphorescent-fluorescent hybrid devices as well.

Further, the organic EL device in accordance with the present invention and the method for fabricating the same provide significantly improved service life and efficiency of the device via use of the electron-transport layer in which a hole-blocking material and an electron-transporting material are mixed.

Still further, the present invention enables simplification of a process for manufacturing phosphorescent-fluorescent hybrid devices, via use of the electron-transport layer in which the hole-blocking material and an electron-transporting material are mixed.

The electroluminescent device of the present invention may be used in or formed as a flexible display for electronic books, newspapers, magazines, and the like, different types of portable devices, handsets, MP3 players, notebook computers, and the like, audio applications, navigation applications, televisions, monitors, or other types of devices using a display, either monochrome or color.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. An electroluminescent (EL) device, comprising:
a stack structure comprising a hole injection layer, a hole transport layer, an emitting layer, an electron-transport layer and an electron injection layer sequentially between a first electrode and a second electrode,
wherein the emitting layer has a red-fluorescent emitting layer, a green-phosphorescent emitting layer and a blue-fluorescent emitting layer on the hole transport layer, respectively,
wherein the electron-transport layer consists of a mixture of a ratio of 5:5 of Balq having hole-blocking properties and BeBq$_2$ having electron-transporting properties and the electron-transport layer is a single layer directly on the emitting layer, and
wherein the electron injection layer consists of LiF and is a single layer directly on the electron-transport layer and the emitting layer is a single layer on the hole transport layer.

2. The device of claim 1, wherein the electron-transport layer has a thickness of between approximately 0.1 and 500 nm.

3. The device of claim 1, wherein at least one of the first electrode and the second electrode is formed of a transparent material.

4. An electroluminescent (EL) device, comprising:
a stack structure comprising a hole injection layer, a hole transport layer, an emitting layer, an electron-transport layer and an electron injection layer sequentially between a first electrode and a second electrode,
wherein the emitting layer has a red-fluorescent emitting layer, a green-phosphorescent emitting layer and a blue-fluorescent emitting layer on the hole transport layer, respectively,
wherein the electron-transport layer consists of a mixture of Balq having hole-blocking properties, BeBq$_2$ having electron-transporting properties, and at least one of an inorganic compound or a metal having electron-injection-facilitating properties or electron-transport-facilitating properties,
wherein the electron-transport layer is a single layer and the electron-transport layer is directly on the emitting layer and
wherein the electron injection layer and is a single layer directly on the electron-transport layer consists of LiF and the emitting layer is a single layer on the hole transport layer.

5. The device of claim 4, wherein, the inorganic compound is selected from the group consisting of an alkaline metal compound, an alkaline earth metal compound, an earth metal compound, and a lanthanide compound.

6. The device of claim 4, wherein, the inorganic compound is a halide compound selected from the group consisting of LiF, NaF, KF, RbF, CsF, FrF, MgF$_2$, CaF$_2$, SrF$_2$, BaF$_2$, LiCl, NaCl, KCl, RbCl, CsCl, and FrCl and an oxide selected from the group consisting of Li$_2$O, Li$_2$O$_2$, Na$_2$O, K$_2$O, Rb$_2$O, $Rb_2O_2$, $Cs_2O$, $Cs_2O_2$, $LiAlO_2$, $LiBO_2$, $LiTaO_3$, $LiNbO_3$, $LiWO_4$, $Li_2CO$, $NaWO_4$, $KAlO_2$, $K_2SiO_3$, $B_2O_5$, $Al_2O_3$, and $SiO_2$.

7. The device of claim 4, wherein the metal having electron-injection-facilitating properties or electron-transport-facilitating properties is selected from the group consisting of an alkaline metal, an alkaline earth metal, an earth metal, a rare earth metal, and alloys thereof.

8. The device of claim 4, wherein the metal having electron-injection-facilitating properties or electron-transport-facilitating properties is selected from the group consisting of Li, Na, K, Cs, Be, Mg, Ca, Sr, Ba, Y, La, Ce, Sm, Gd, Eb, Yb, an Al:Li alloy, a Mg:Sr alloy, and an In:Li alloy.

9. An organic electroluminescent (EL) device, comprising:
a plurality of emitting units each comprising a hole injection layer, a hole transport layer, an emitting layer, an electron-transport layer, and an electron injection layer sequentially, the emitting units provided between an anode and a cathode,
wherein adjacent emitting units are separated by interlayers, and wherein each electron-transport layer consists of a mixture of Balq having hole-blocking properties, $BeBq_2$ having electron-transporting properties, and at least one material having at least one of an inorganic compound or a metal, wherein the electron-transport layer is a single layer
wherein each emitting layer has a red-fluorescent emitting layer, a green-phosphorescent emitting layer and a blue-fluorescent emitting layer on the hole transport layer, respectively, and the electron-transport layer is directly on the emitting layer and
wherein each electron injection layer consists of LiF and is a single layer directly on the electron-transport layer and the emitting layer is a single layer on the hole transport layer.

10. A method of fabricating an organic electroluminescent (EL) device, the method comprising:
forming a first electrode on a substrate;
forming sequentially a hole injection layer, a hole transport layer, an emitting layer including at least one phosphorescent material, an electron-transport layer, and an electron injection layer on the first electrode; and
forming a second electrode on the electron injection layer,
wherein the emitting layer has a red-fluorescent emitting layer, a green-phosphorescent emitting layer and a blue-fluorescent emitting layer on the hole transport layer, respectively and
wherein the electron-transport layer consists of a mixture of a ratio of 5:5 of Balq having hole-blocking properties and $BeBq_2$ having electron-transporting properties and the electron-transport layer is directly on the emitting layer as a single layer and
wherein the electron injection layer consists of LiF and is a single layer directly on the electron-transport layer.

11. The method of claim 10, wherein the first electrode is an anode, and the second electrode is a cathode.

* * * * *

UNITED STATES PATENT AND TRADEMARK OFFICE
CERTIFICATE OF CORRECTION

PATENT NO. : 8,563,144 B2
APPLICATION NO. : 11/357951
DATED : October 22, 2013
INVENTOR(S) : Kim et al.

Page 1 of 1

It is certified that error appears in the above-identified patent and that said Letters Patent is hereby corrected as shown below:

Title Page, Item (75) should read:

(75) Inventors: Myung Seop Kim, Seoul (KR); Jeong Dae Seo, Gwacheon-si (KR); Jae Man Lee, Seoul (KR); Kyung Hoon Lee, Seoul (KR); Chang Je Sung, Seoul (KR); Sang Tae Park, Gyeonggi-do (KR); Eun Soo Cha, Gwacheon-si (KR)

Signed and Sealed this
Fourth Day of February, 2014

Michelle K. Lee
*Deputy Director of the United States Patent and Trademark Office*